United States Patent
Kondo

(10) Patent No.: US 8,339,614 B2
(45) Date of Patent: Dec. 25, 2012

(54) METHOD OF MEASURING SHOT SHAPE AND MASK

(75) Inventor: Shinjiro Kondo, Kounosu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/886,665

(22) PCT Filed: Mar. 23, 2006

(86) PCT No.: PCT/JP2006/305837
§ 371 (c)(1), (2), (4) Date: Sep. 19, 2007

(87) PCT Pub. No.: WO2006/104011
PCT Pub. Date: Oct. 5, 2006

(65) Prior Publication Data
US 2009/0033948 A1  Feb. 5, 2009

(30) Foreign Application Priority Data
Mar. 25, 2005 (JP) .............................. P2005-087625

(51) Int. Cl.
*G01B 11/14* (2006.01)
(52) U.S. Cl. .......... 356/616; 355/53; 356/601; 356/124; 430/394
(58) Field of Classification Search ........... 356/601, 356/614–620, 124, 399–401, 498, 508; 355/53; 430/394
See application file for complete search history.

(56) References Cited

U.S. PATENT DOCUMENTS

| 5,402,224 A | * | 3/1995 | Hirukawa et al. .......... 356/124 |
| 5,473,435 A | | 12/1995 | Masuyuki et al. |
| 5,615,006 A | * | 3/1997 | Hirukawa et al. .......... 356/124 |
| 5,666,205 A | | 9/1997 | Tateno et al. |
| 5,798,195 A | | 8/1998 | Nishi |
| 5,939,226 A | | 8/1999 | Tomimatu |
| 5,969,441 A | | 10/1999 | Loopstra et al. |
| 5,995,199 A | * | 11/1999 | Shinozaki et al. .......... 355/53 |

(Continued)

FOREIGN PATENT DOCUMENTS

JP   A 64-68926   3/1989

(Continued)

OTHER PUBLICATIONS

Extended European Search Report issued in EP Application No. 06729785.3 on May 6, 2009.

(Continued)

*Primary Examiner* — Tarifur Chowdhury
*Assistant Examiner* — Isiaka Akanbi
(74) *Attorney, Agent, or Firm* — Oliff & Berridge, PLC

(57) ABSTRACT

A method of measuring shot shape includes sequentially exposing a substrate with main scale marks (32) in compliance with a predetermined map, and forming a reference grid including a plurality of the main scale marks (32) arranged in the predetermined map in at least one shot region, exposing a shot for measuring, via a projection optical system, that includes a plurality of auxiliary scale marks (34) arranged in the predetermined map in the shot region, measuring a relative positional relationship between adjacent main scale marks (32), measuring an amount of deviation between the main scale marks (32) and the auxiliary scale marks (34), and correcting the reference grid based on the relative positional relationship, and calculating a shot shape of the shot for measuring based on the corrected reference grid and the amount of deviation.

8 Claims, 8 Drawing Sheets

U.S. PATENT DOCUMENTS

| | | | |
|---|---|---|---|
| 6,118,517 A * | 9/2000 | Sasaki et al. | 355/53 |
| 6,208,407 B1 | 3/2001 | Loopstra | |
| 6,238,851 B1 | 5/2001 | Nishi | |
| 6,906,303 B1 | 6/2005 | Smith | |
| 6,947,119 B2 * | 9/2005 | Fukagawa | 355/52 |
| 7,099,011 B2 | 8/2006 | McArthur et al. | |
| 7,262,398 B2 | 8/2007 | Smith | |
| 7,268,360 B2 | 9/2007 | Smith et al. | |
| 7,271,905 B2 | 9/2007 | Smith et al. | |
| 7,941,232 B2 * | 5/2011 | Ishii et al. | 700/29 |
| 2002/0159040 A1 * | 10/2002 | Hamatani et al. | 355/52 |
| 2004/0119956 A1 * | 6/2004 | Fukagawa | 355/52 |
| 2004/0233402 A1 | 11/2004 | Smith | |
| 2005/0118514 A1 * | 6/2005 | Tsai | 430/5 |

FOREIGN PATENT DOCUMENTS

| | | |
|---|---|---|
| JP | A 64-068926 | 3/1989 |
| JP | A-03-195013 | 8/1991 |
| JP | A H6-124873 | 5/1994 |
| JP | A-06-176999 | 6/1994 |
| JP | A-06-349702 | 12/1994 |
| JP | A-08-078309 | 3/1996 |
| JP | A-09-015098 | 1/1997 |
| JP | A-09-244222 | 9/1997 |
| JP | A 10-097969 | 4/1998 |
| JP | A 10-97969 | 4/1998 |
| JP | A 10-163099 | 6/1998 |
| JP | A 10-214783 | 8/1998 |
| JP | A 11-135400 | 5/1999 |
| JP | A 2000-505958 | 5/2000 |
| JP | A-2000-275816 | 10/2000 |
| JP | A 2002-367886 | 12/2002 |
| JP | A-2003-037049 | 2/2003 |
| JP | A 2004-063905 | 2/2004 |
| JP | A 2006-106240 | 4/2006 |
| JP | A-2006-135281 | 5/2006 |
| WO | WO 99/49504 | 9/1999 |

OTHER PUBLICATIONS

Examination Report issued in SG Application No. 200708347-0 on Jan. 15, 2009.

International Search Report issued in Application No. PCT/JP2006/305837 on Jun. 20, 2006 (with English translation).

Written Opinion issued in Application No. PCT/JP2006/305837 on Jun. 20, 2006 (with English translation).

Jul. 29, 2011 Office Action issued in European Patent Application No. 06729785.3

Office Action issued in JP Application No. 2007-510434 on Apr. 12, 2011 (with English translation).

Oct. 29, 2012 Office Action issued in EP Application No. 06729785.3.

* cited by examiner

METHOD OF MEASURING SHOT SHAPE AND MASK

TECHNICAL FIELD

The present invention relates to method of measuring a shape of a shot region, and a mask used in this measuring.

Priority is claimed on Japanese Patent Application No. 2005-087625, filed Mar. 25, 2005, the content of which is incorporated herein by reference.

BACKGROUND ART

Exposure apparatuses such as a reduction projection exposure apparatus using a step-and-repeat system (i.e., a stepper) and a scanning projection exposure apparatus using a step-and-scan system (i.e., a scanning stepper) are used during a lithography process in manufacturing semiconductor elements, liquid crystal display elements, etc. As semiconductor elements become more highly integrated, there is a demand that these exposure apparatuses fabricate finer circuit patterns on a photosensitive substrate.

To make the circuit pattern finer, imaging characteristics of a projection optical system that projects a pattern image of a mask onto a photosensitive substrate must be adjusted to a best possible level. To adjust the imaging characteristics, there are methods of determining an amount of distortion of the projection optical system.

For example, in a method disclosed in Patent Literature 1, a reticle blind and the like is used in limiting an exposure region such that, after the projection optical system exposes a plurality of first patterns on a photosensitive substrate, only a second pattern can be exposed; the second pattern is exposed over a latent image of the first patterns by moving the photosensitive substrate by fixed amounts based on the design-dependent arrangement of the first patterns, and the distortion amount of the projection optical system is determined by measuring the latent images of the first and second patterns. Developed patterns can be used instead of latent images of the patterns.

Patent Literature 1: Japanese Unexamined Patent Publication No. S64-068926

DISCLOSURE OF INVENTION

Problems to be Solved by the Invention

In the technique described above, at the time of exposing the second pattern on the photosensitive substrate, a substrate stage on which the photosensitive substrate is mounted is moved by fixed amounts. Since there is a margin of error when positioning the substrate stage, the second pattern that forms a reference includes positional deviation. It is therefore necessary to increase the number of measurement points for measuring positional deviation between the first pattern and the second pattern, and to determine an average position deviation of the measurement points as the lens distortion; there is a consequent problem that measurement of highly precise lens distortion is limited.

Moreover, to determine lens distortion in all shot regions on the photosensitive substrate, all measurement points in all the shot regions must be measured; this is problematic in that measuring takes a long time.

A purpose of some aspects of the invention is to provide a method of measuring shot shape that can determine lens distortion and the like with high precision while reducing the measuring load, and a mask used in the method.

Means for Solving the Problem

A first aspect of the invention provides a method of measuring shot shape including: sequentially exposing a substrate with main scale marks in compliance with a predetermined map, and forming a reference grid including a plurality of the main scale marks arranged in the predetermined map in at least one shot region, exposing a shot for measuring, via a projection optical system, that includes a plurality of auxiliary scale marks arranged in the predetermined map in the shot region, measuring a relative positional relationship between adjacent main scale marks, measuring an amount of deviation between the main scale marks and the auxiliary scale marks, and correcting the reference grid based on the relative positional relationship, and calculating a shot shape of the shot for measuring based on the corrected reference grid and the amount of deviation.

According to this aspect, before determining the shot shape of the shot for measuring from the amount of deviation between the main scale mark and the auxiliary scale marks and the relationship of the reference grid, the reference grid is corrected by measuring the relative positional relationship between adjacent main scale marks; therefore, the shot shape of the shot for measuring can be determined with high precision.

Simultaneous to exposing the main scale mark, surrounding marks, which are used in measuring a relative positional relationship between the main scale mark and another main scale mark formed adjacent to it, can be formed between the main scale mark and the other main scale mark. This makes it possible to measure the relative positional relationship between the main scale marks using the surrounding marks.

Furthermore, when the reference grid is formed by multiple exposures of main scale mark groups, constituted by grouping a plurality of main scale marks, in a shot region, the number of measurement points where the relative positional relationship between the main scale marks is measured can be reduced by sequentially exposing the mark scale mark groups including a plurality of main scale marks whose positional relationship is determined beforehand.

If the main scale mark group is formed with a plurality of main scale marks arranged in a row, it is easy to determine the amount of relative rotation between main scale mark groups.

Furthermore, if the calculation of the shot shape includes correcting the reference grid by using a statistical method of processing the relative positional relationship that is measured, a shot shape of the shot for measuring that is most statistically ideal (i.e. that has the least error) can be determined with high precision.

A second aspect of the invention provides a mask including at least one main scale mark, auxiliary scale marks that are arranged in a grid formation along a first direction and a second direction orthogonal to the first direction, the auxiliary scale mark and the main scale mark are superimposed to indicate a relative amount of deviation between them, and at least one pair of surrounding marks arranged such as to sandwich the main scale mark, the pair of surrounding marks include a main surrounding mark, and an auxiliary surrounding mark that is separated by a grid interval of the auxiliary scale mark from the main surround mark, and the auxiliary surrounding mark and the main surrounding mark are superimposed to indicate a relative amount of deviation between them.

According to this aspect, before exposing the main scale mark and the auxiliary scale marks in superimposition on the photosensitive substrate and measuring the relative amount of deviation between them, main surrounding marks arranged around the main scale mark and auxiliary surrounding marks arranged around an adjacent other main scale mark are exposed in superimposition, and the relative positional relationship between the main scale marks is measured, whereby the relative amount of deviation between the main scale mark and the auxiliary scale marks can be determined with high precision.

If a plurality of the main scale marks are arranged in a row along the first direction, and the main surrounding marks and the auxiliary surrounding marks are arranged in separation along the second direction, the amount of relative rotation between main scale marks can be easily measured by sequentially exposing a plurality of main scale marks whose positional relationship is determined beforehand; in addition, the number of measurement points where the relative positional relationship of the main scale marks is measured can be reduced.

If the mask is used by being mounted on a scanning exposure apparatus with the marks arranged such that the second direction becomes a scanning direction of the scanning exposure apparatus, the alignment direction of the plurality of main scale marks arranged in a row (first direction) for formation of the reference grid is orthogonal to the scanning direction, thereby ensuring that the alignment of the main scale marks in the first direction does not contain synchronous movement error.

Advantage of the Invention

The invention can obtain the following advantage.

Since the invention enables the relative amount of deviation between the main scale marks and the auxiliary scale marks to be measured with high precision after correcting alignment error of the main scale marks, lens distortion of the projection optical system in each shot region can be determined with high precision.

Therefore, according to the invention, a finer circuit pattern can be exposed on a photosensitive substrate with high precision, and a high-performance device can be manufactured.

BEST MODE FOR CARRYING OUT THE INVENTION

Embodiments of a shot shape measuring method and a mask of the invention will be explained with reference to the drawings.

Figure 1:
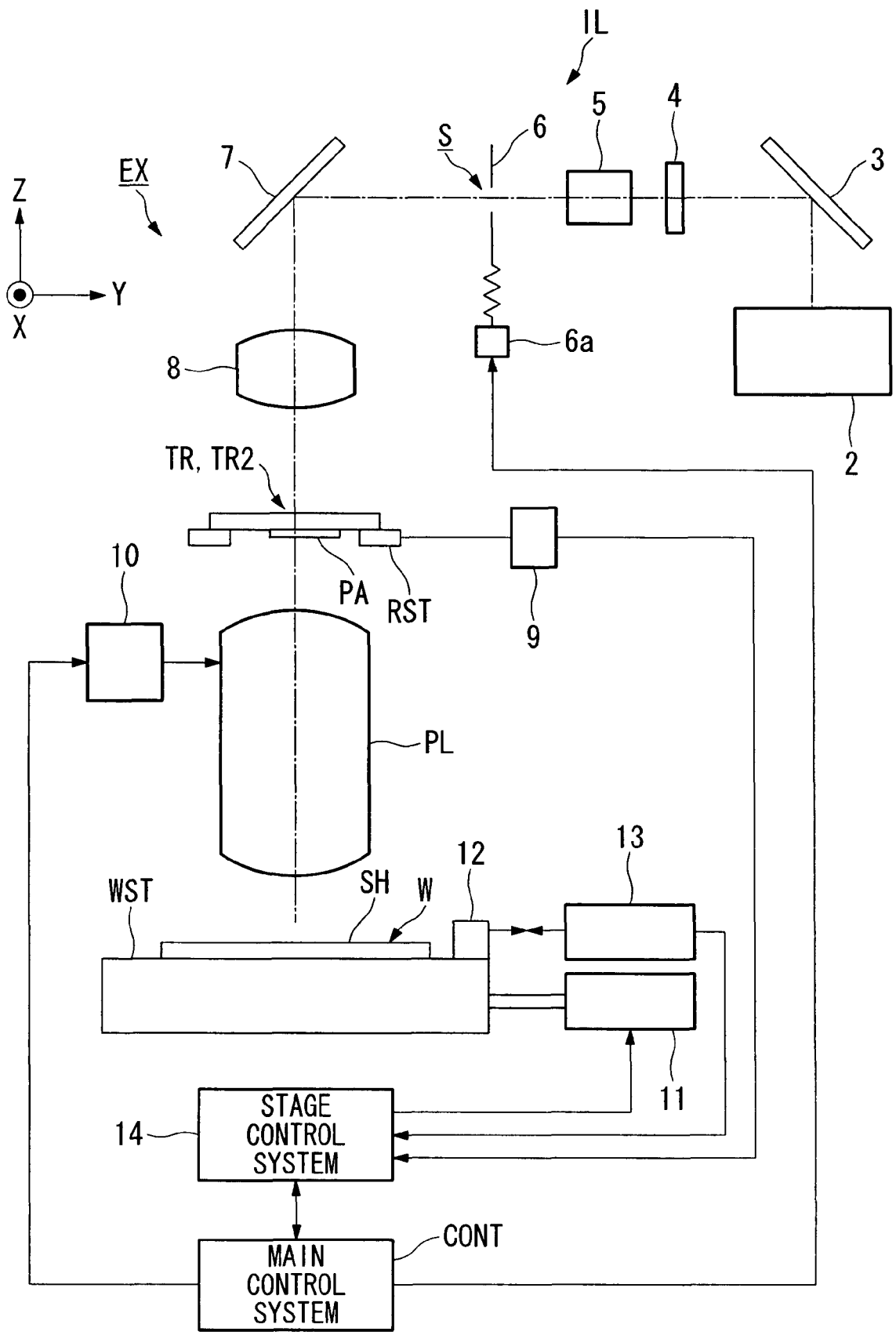
FIG. 1 is a schematic view showing the configuration of an exposure apparatus according to a first embodiment.

FIG. 1 is a schematic view showing the configuration of an exposure apparatus EX according to this embodiment. The exposure apparatus EX is a scanning exposure apparatus using a step-and-scan system, namely a scanning stepper, that synchronously moves a reticle TR and a wafer W in a one-dimensional direction while using a projection optical system PL to transfer a pattern PA formed on the reticle TR to shot regions SH on the wafer W.

In the following explanation, a direction matching the optical axis of the projection optical system PL is termed Z-direction, a direction of synchronous movement of the reticle TR and the wafer W (scanning direction) in a plane perpendicular to the Z-direction is termed Y-direction, and a direction perpendicular to the Z-direction and the Y-direction (non-scanning direction) is termed X-direction. Directions of rotation (inclination) around the X-axis, the Y-axis, and the Z-axis are respectively termed θX-direction, θY-direction, and θZ-direction.

The exposure apparatus EX includes an illumination optical system IL that illuminates the reticle TR with exposure light EL, a movable reticle stage RST that holds the reticle TR, a projection optical system PL that projects the exposure light EL emitted from the reticle TR onto the wafer W, a movable wafer stage WST that holds the wafer W, a main control system CONT that collectively controls the exposure apparatus EX, and such like.

The illumination optical system IL illuminates the reticle TR with exposure light EL, and includes a reflecting mirror 3, a wavelength selection filter 4, an optical integrator (field lens or rod) 5, a blind (field stop) 6, a reflecting mirror 7, and a lens system 8.

Specifically, the exposure light EL is emitted from a light source 2 such as an ultra-high pressure mercury lamp and an excimer laser, is reflected by the reflecting mirror 3, and is incident on the wavelength selection filter 4 that only transmits light at a wavelength required for exposure. Exposure light EL transmitted through the wavelength selection filter 4 is adjusted to a beam with uniform intensity distribution by the optical integrator 5 before reaching the blind 6.

The blind 6 uses a driving system 6a to drive each of a plurality of blades that specify an opening S, and sets an illumination region on the reticle TR illuminated by the exposure light EL by changing the size of the opening S.

Exposure light EL passing through the opening S of the blind 6 is reflected by the reflecting mirror 7 and becomes incident on the lens system 8. The lens system 8 images the image of the opening S of the blind 6 onto the reticle TR held on the reticle stage RST, illuminating a predetermined region of the reticle TR.

The reticle stage RST supports the reticle TR while being moved by a driving device 9 such as a linear motor in the X-direction and the Y-direction that are perpendicular and orthogonal to the optical axis direction of the projection optical system PL (Z-direction), and also in the rotational direction around the Z-axis. Incidentally, the reticle TR is vacuumed by an unillustrated reticle vacuum contact mechanism provided around a rectangular opening in the reticle stage RST, etc.

The positions in the X-direction and Y-direction of the reticle TR on the reticle stage RST and the rotational angle around the Z-axis are detected by an unillustrated laser interferometer. Measurements taken by this laser interferometer are output to a stage control system 14.

An image of the pattern PA in an illumination region of the reticle TR is formed via the projection optical system PL on the wafer W that is coated with resist. Consequently, each shot region SH on the wafer W mounted on the wafer stage WST is exposed with an image of the pattern PA of the reticle TR.

The pattern PA formed on the reticle TR will be explained later.

Using a plurality of lens elements that are configured in groups and arranged inside a lens barrel at predetermined intervals along the optical axis direction, the projection optical system PL projects an image of the pattern PA on the reticle TR onto the wafer W at a predetermined magnification m (in this embodiment m=¼).

Various imaging characteristics of the projection optical system PL can be adjusted by moving the lens elements in the optical axis direction using a plurality of expandable driving elements that are arranged in a circumferential direction. For example, when the lens elements are moved in the optical axis direction, the magnification around the optical axis can be changed.

Furthermore, the distortion can be changed when the lens elements are tilted around an axis perpendicular to the optical axis.

Instead of moving the lens elements, the imaging characteristics of the projection optical system can be adjusted by controlling the air pressure in sealed spaces between the lens elements.

Imaging characteristics of the projection optical system PL are adjusted by an imaging characteristics adjusting device 10 that is collectively controlled by the main control system CONT.

The wafer stage WST includes a wafer holder (not shown) for vacuuming the wafer W, and is moved by a driving device 11 such as a linear motor in the Z-direction and the Y-direction which intersect each other and are perpendicular to the optical axis of the projection optical system PL (Z-direction).

The wafer W is moved two-dimensionally with respect to the projection optical system PL on the image-plane side thereof, enabling an image of the pattern PA of the reticle TR to be transferred to each shot region on the wafer W.

A moving mirror 12 provided at an end of the wafer stage WST and the laser interferometer 13 that irradiates laser light onto the moving mirror 12 detect the X- and Y-directional positions of the wafer stage WST (and thus the wafer W) and its amount of rotation ($\theta X$, $\theta Y$, and $\theta Z$). Measurements (positional information) obtained by the laser interferometer 13 are output to the stage control system 14. The stage control system 14 is controlled by the main control system CONT.

Figure 2A:
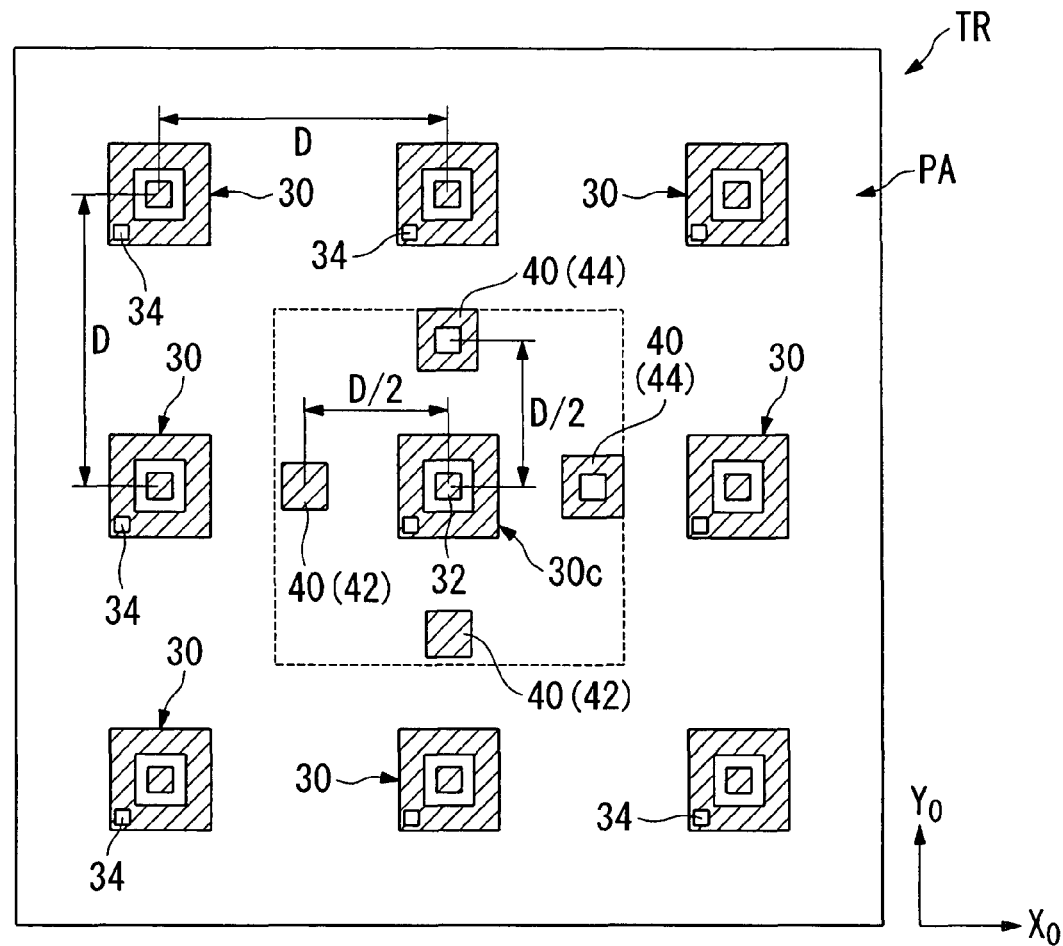
FIG. 2A is a conceptual view showing a reticle according to a first embodiment.
Figure 2B:
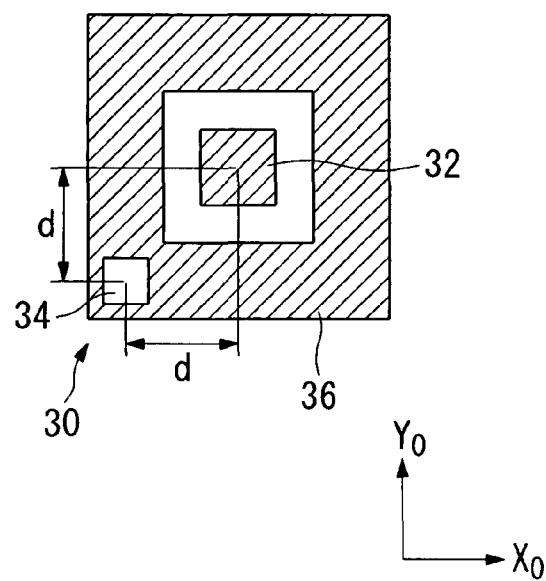
FIG. 2B is a conceptual view showing a reticle according to a first embodiment.
Figure 2C:
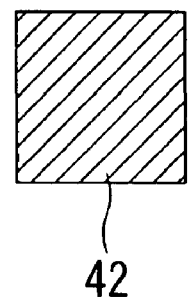
FIG. 2C is a conceptual view showing a reticle according to a first embodiment.
Figure 2D:
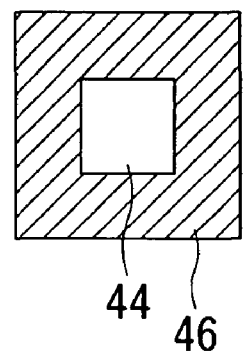
FIG. 2D is a conceptual view showing a reticle according to a first embodiment.

FIGS. 2A to 2D are conceptual diagrams of a reticle TR according to this embodiment. FIG. 2A is a plan view, FIG. 2B is an enlarged view of a mark 30, FIG. 2C is an enlarged view of a main surrounding mark 42, and FIG. 2D is an enlarged view of an auxiliary surrounding mark 44. For sake of convenience, the dimensions shown in FIGS. 2A to 2D differ from the actual dimensions.

The reticle TR is used in measuring distortion of the projection optical system PL, and, as shown in FIG. 2A, includes a pattern PA of chrome, molybdenum silicide, and such like that is formed on a light-transmitting flat plate of quartz glass and such like.

The pattern PA is constituted from a plurality of light-blocking marks 30 which are regularly arranged at predetermined intervals in directions $X_0$ and $Y_0$. In FIG. 2A, the light-blocking portions are represented by hatching. While FIG. 2A shows nine marks 30, there actually several tens of them.

The marks 30 are configured such that, when the projection optical system PL exposes them in superimposition on the wafer W, positional deviation between the superimposed marks 30 can be measured.

Specifically, as shown in FIG. 2B, each mark 30 includes a substantially square-shaped light-blocking main scale mark 32, a hollow square-shaped light-blocking portion 36 that encloses the main scale mark 32, and a substantially square-shaped light-transmitting auxiliary scale mark 34 provided inside the light-blocking portion 36 at a distance d from the main scale mark 32 in each of the directions $X_0$ and $Y_0$.

Figure 4A:
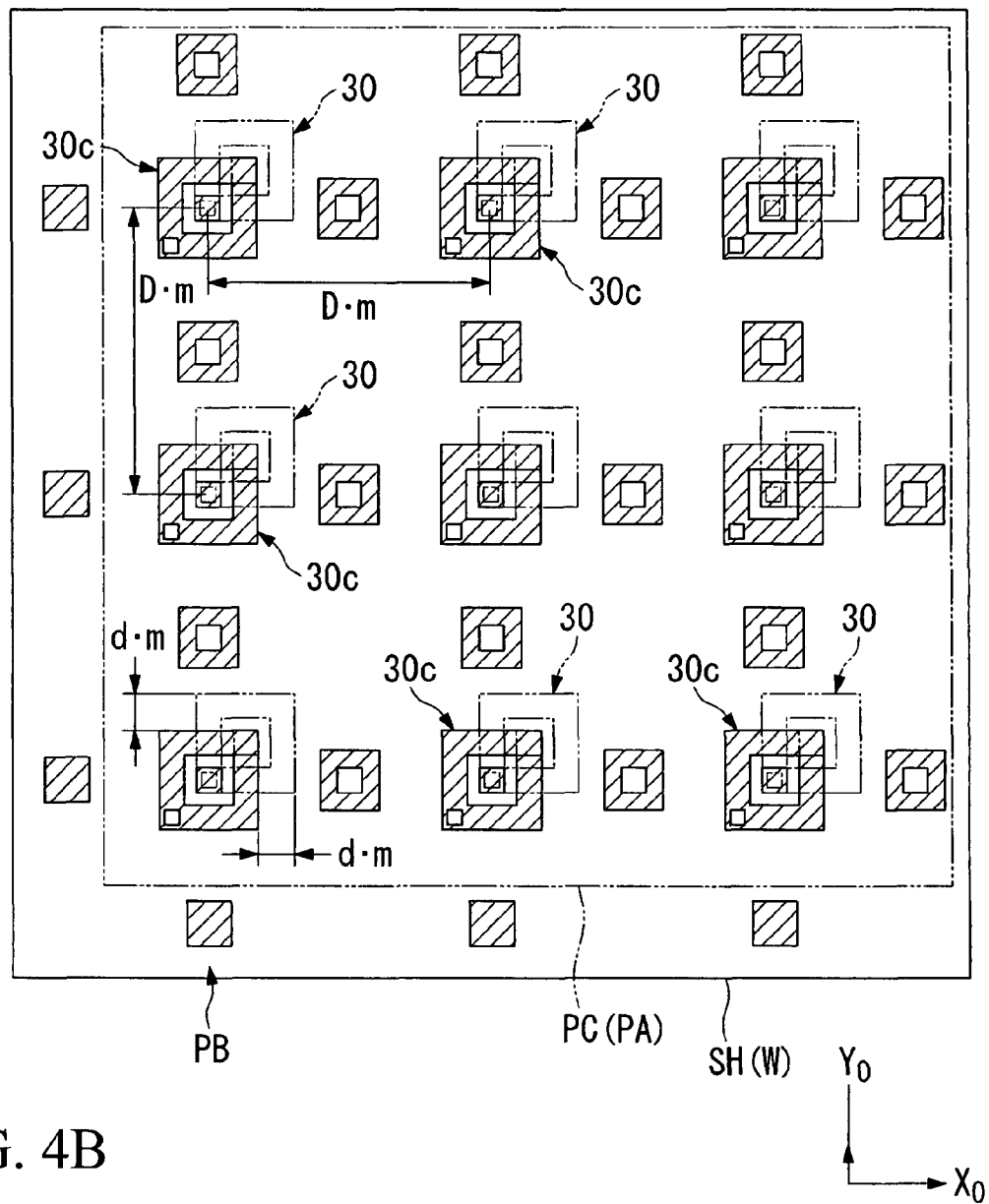
FIG. 4A shows a shot for measuring exposed over a reference grid.
Figure 4B:
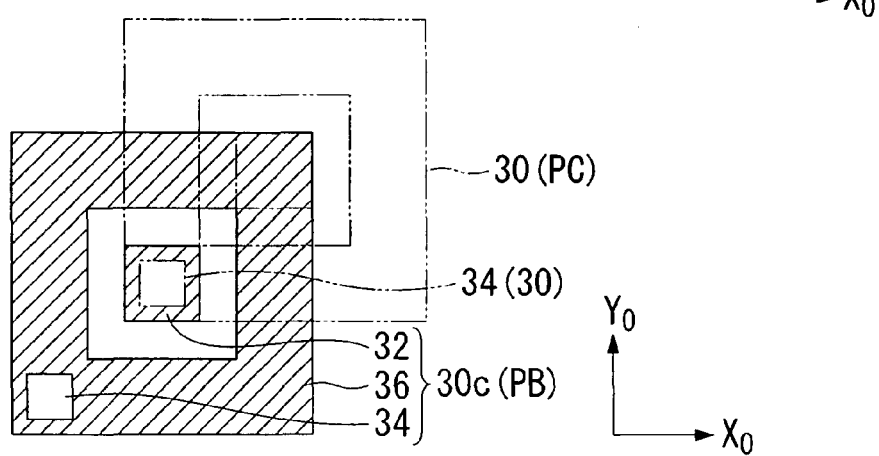
FIG. 4B shows a shot for measuring exposed over a reference grid.

With this configuration, after using the projection optical system PL to expose the mark 30 onto the wafer W, the wafer W is moved a distance of d•m (m being the projection magnification) in each of the directions $X_0$ and $Y_0$, and the mark 30 is then exposed again to the wafer W, whereby the auxiliary scale mark 34 is exposed inside the main scale mark 32 (see FIG. 4B). This makes it possible to measure the relative positional error of the auxiliary scale mark 34 (excluding the d•m movement portion) with respect to the main scale mark 32.

As shown in FIG. 2A, a surrounding mark 40 is arranged around a mark 30c which is at a substantially central position of the plurality of marks 30.

The surrounding mark 40 includes main surrounding marks 42 arranged respectively at adjacent the $-X_0$ direction side and the $-Y_0$ direction side of the mark 30c, and auxiliary surrounding marks 44 arranged respectively at adjacent the $+X_0$ direction side and the $+Y_0$ direction side of the mark 30c.

As shown specifically in FIG. 2C, the main surrounding mark 42 is similar to the main scale mark 32 in being a substantially square light-blocking mark. As shown in FIG. 2D, the auxiliary surrounding mark 44 is a substantially square light-transmitting mark formed inside the substantially square light-blocking portion 46, which is larger than the main surrounding mark 42.

The main surrounding marks 42 and the auxiliary surrounding marks 44 are arranged at intermediate positions between the mark 30c and an adjacent other mark 30. That is, since the marks 30 are arranged at intervals of D in the $X_0$ and $Y_0$ directions, the mark 30c and the surrounding mark 40 are each arranged at intervals of D/2 in the $X_0$ and $Y_0$ directions. In other words, the main surrounding marks 42 and the auxiliary surrounding marks 44 are arranged at an interval D which is identical to the arrangement interval D between the marks 30.

With this configuration, by performing a plurality of exposures of the mark 30c and the surrounding marks 40 (the main surrounding marks 42 and the auxiliary surrounding marks 44) while moving the wafer W by an interval of D•m in each of the $X_0$ and $Y_0$ directions, a plurality of marks 30c and surrounding marks 40 are formed on the wafer W. The surrounding mark 40 of each mark 30c then overlaps with the surrounding mark 40 of the adjacent other mark 30c. Specifically, the auxiliary surrounding mark 44 of the adjacent other mark 30c is exposed in superimposition inside each main surrounding mark 42 (see FIG. 3B). This makes it possible to measure the relative positional error of the auxiliary surrounding mark 44 with respect to the main surrounding mark 42.

Subsequently, a method of measuring the lens distortion of the projection optical system PL using the exposure apparatus EX and the reticle TR configured as described above will be explained with reference to the drawings.

The lens distortion of the projection optical system PL is measured by performing a step S1 of sequentially exposing only the marks 30c of the reticles TR in a shot region SH on the wafer W in compliance with the map of the marks 30 in the pattern PA, a step S2 of exposing the pattern PA in the shot region SH, a step S3 of measuring the relative positional relationship between a plurality of the marks 30c exposed on the wafer W in step S1, a step S4 of measuring the amount of positional deviation between the plurality of marks 30c exposed on the wafer W in step S1 and the plurality of marks 30 exposed on the wafer W in step S2, and a step S5 of determining the lens distortion of the projection optical system PL from the measurement results of steps S3 and S4.

Firstly in step S1, with the reticle TR held on the reticle stage RST, the opening S in the blind 6 is specify by operating the driving system 6a of the illumination optical system IL. Specifically, the opening S is set such that, of the pattern PA of the reticle TR, only the central mark 30c and its surrounding marks 40 constitute an illumination region. That is, the opening S is controlled such that only the region within the broken line of FIG. 2A is illuminated.

Figure 3A:
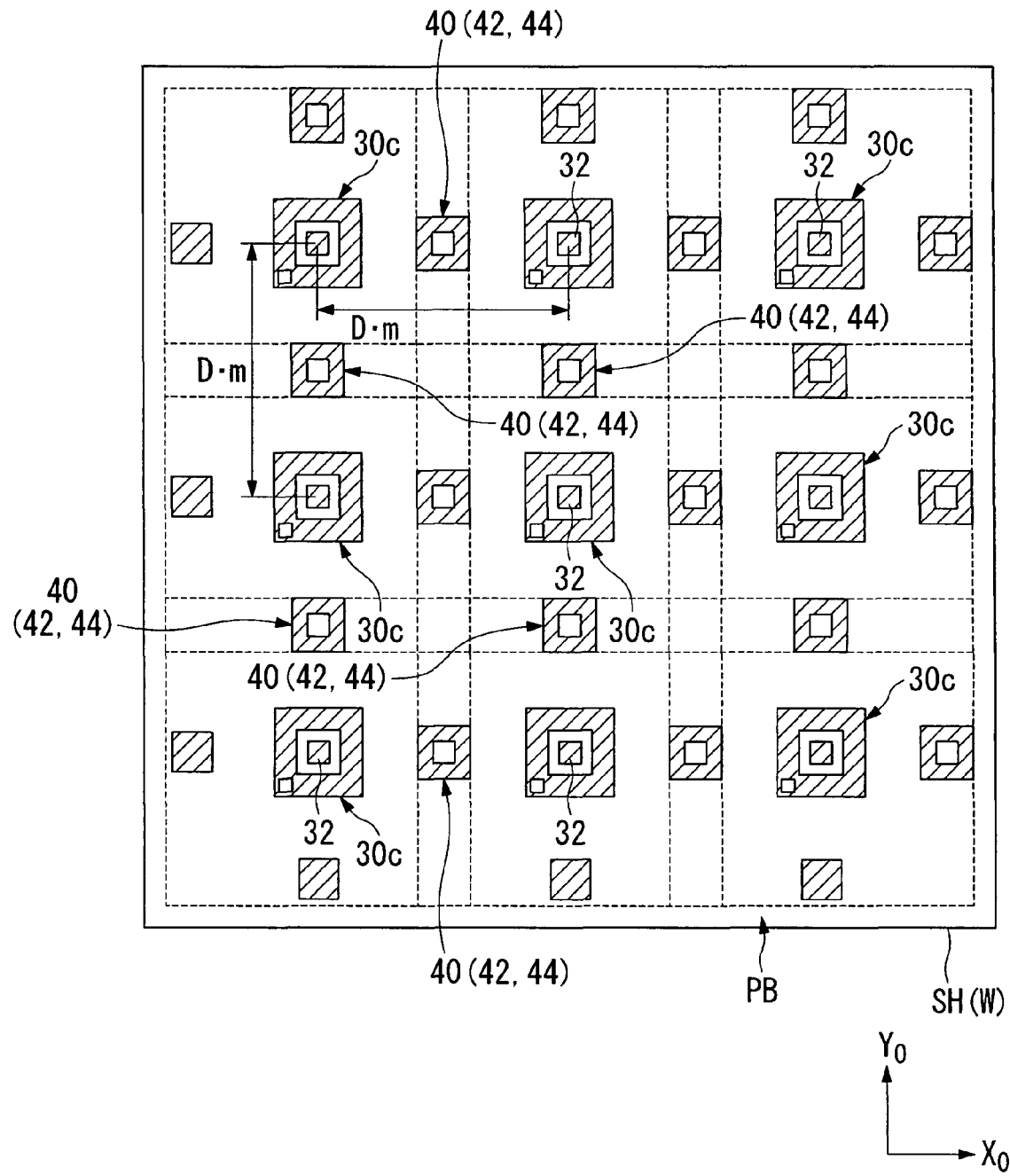
FIG. 3A shows a reference grid formed in a shot region of a wafer.

The mark 30c and the surrounding marks 40 are then transferred by multiple exposures in one shot region SH of the wafer W mounted on the wafer stage WST, forming a reference grid PB. Specifically, the mark 30c and the surrounding marks 40 are exposed on the wafer W while moving the wafer stage WST a distance D•m in each of the directions $X_0$ and $Y_0$. Consequently, as shown in FIG. 3A, a plurality of marks 30c and surrounding marks 40 are orderly arranged in the shot region SH such that they are away from each other by interval D·m in each of the directions $X_0$ and $Y_0$. Of this pattern, a plurality of main scale marks 32 are orderly arranged such that they are away from each other by interval D·m in each of the directions $X_0$ and $Y_0$, and thereby form the reference grid PB.

Figure 3B:
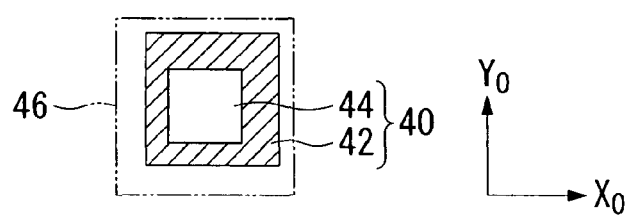
FIG. 3B shows a reference grid formed in a shot region of a wafer.

When the reference grid PB is formed in the shot region SH of the wafer W by using the marks 30c, the surrounding marks 40 (main surrounding marks 42 and auxiliary surrounding marks 44) arranged around each of the main scale marks 32 that constitute the reference grid PB are superimposed with the surrounding marks 40 of an adjacent other main scale mark 32, as shown in FIG. 3B, simultaneous to forming the main scale mark 32. That is, the main surrounding marks 42 arranged at adjacent the $-X_0$ direction side of one main scale mark 32 are superimposed with the auxiliary surrounding marks 44 arranged at adjacent the $+X_0$ direction side of another main scale mark 32 adjacent to the $-X_0$ direction side of that main scale mark 32. Similarly, the main surrounding marks 42 arranged in the $-Y_0$ direction of one main scale mark 32 are superimposed with the auxiliary surrounding marks 44 arranged in the $+Y_0$ direction of another main scale mark 32 adjacent to the $-Y_0$ direction of that main scale mark 32.

Thus the reference grid PB is formed such that the main surrounding marks 42 and the auxiliary surrounding marks 44 are superimposed between adjacent main scale marks 32. These superimposed main surrounding marks 42 and auxiliary surrounding marks 44 are used in measuring the relative positional relationship between adjacent main scale marks 32 in a subsequent step.

To facilitate understanding in the above explanation, marks of the reticle TR are transferred onto the wafer W as erected images. However, as shown in the drawings, the axial direction of the coordinate system on the reticle TR matches that of the coordinate system on the wafer. The same applies in the explanation below.

In step S2, the pattern PA of the reticle TR is exposed over the reference grid PB in the shot region SH.

That is, the opening S of the blind 6 is widened by operating the driving system 6a of the illumination optical system IL, such that the whole of the pattern PA of the reticle TR becomes the illumination region. The pattern PA of the reticle TR is then exposed over the reference grid PB that is already formed in the shot region SH of the wafer W.

As described above, the shape of the reference grid PB resembles the shape of the pattern PA. That is, the plurality of main scale marks 32 of the reference grid PB are orderly arranged at intervals of D in the $X_0$ and $Y_0$ directions. The plurality of marks 30 of the pattern PA are orderly arranged at intervals of D·m in the $X_0$ and $Y_0$ directions. The pattern PA can be therefore superimposed over the reference grid PB by being projected at magnification m by the projection optical system PL.

When superimposing the pattern PA over the reference grid PB, it is exposed at positions separated by d·m in the $-X_0$ and $-Y_0$ directions. As shown in FIG. 4A, the auxiliary scale marks 34 of the pattern PA are deviated (by −d·m and −d·m) with respect to the main scale marks 32 (actually including the auxiliary scale marks 34) of the reference grid PB. Therefore, as shown in FIG. 4B, by exposing the marks 30 of the pattern PA at positions deviating by −d·m and −d·m with respect to the main scale marks 32 of the reference grid PB, the auxiliary scale marks 34 of the pattern PA are superimposed in the main scale marks 32 of the reference grid PB.

Thus the auxiliary scale marks 34 superimposed inside the main scale marks 32 in the shot region SH of the wafer W are orderly arranged at intervals of D·m in the $X_0$ and $Y_0$ directions.

The plurality of auxiliary scale marks 34 of the pattern PA (i.e., the pattern of the plurality of auxiliary scale marks 34 that are orderly arranged at intervals of D·m in the $X_0$ and $Y_0$ directions) is termed a shot for measuring PC. As mentioned above, this shot for measuring PC is formed by widening the opening S in the blind 6 such as to use a wide range of valid inner diameter of the projection optical system PL, and then transferring a plurality of marks of the pattern PA of the reticle TR to the shot region SH of the wafer W in one operation. Therefore, the arrangement of the auxiliary scale marks 34 of the shot for measuring PC contains arrangement error caused by lens distortion of the projection optical system PL. That is, the reference grid PB that does not contain lens distortion is superimposed with the shot for measuring PC containing lens distortion in the shot region SH of the wafer W. The superimposed reference grid PB and shot for measuring PC are used for measuring distortion of the shot region SH in a subsequent step.

Subsequently in step S3, the amount of deviation of the reference grid PB formed in the shot region SH of the wafer W in step S1, i.e. the relative positional relationship between the main scale marks 32 that constitute the reference grid PB, is measured.

The wafer W is unloaded from the exposure apparatus EX and developed. The deviation amount of the reference grid PB on the wafer W after development is measured by a position measuring device using image processing. Specifically, the relative positional relationship of the main scale marks 32 constituting the reference grid PB is determined based on the relative positional relationship of the main surrounding marks 42 and the auxiliary surrounding marks 44 that are superimposed between the main scale marks 32.

As described above, the main scale mark 32 and the surrounding marks 40 arranged around it are formed by transferring the mark 30c (main scale mark 32) and the surrounding marks 40 of the reticle TR onto the wafer W by exposure. Therefore, the relative positional relationship between the main scale marks 32 constituting the reference grid PB and the surrounding marks 40 (main surrounding marks 42 and auxiliary surrounding marks 44) arranged around the main scale marks 32 is already known. This makes it possible to determine the relative positional relationship between one main scale mark 32 and another main scale mark 32 that is adjacent to it in the $-X_0$ direction based on the relative positional relationship between the main surrounding marks 42 arranged at adjacent the $-X_0$ direction side of one main scale mark 32 and the auxiliary surrounding marks 44 arranged at adjacent the $+X_0$ direction side of another main scale mark 32 that is adjacent to the main scale mark 32 in the $-X_0$ direction.

Accordingly, the relative positional relationship between the main scale marks 32 constituting the reference grid PB is measured by using the position measuring device to image-process the overlay of the surrounding marks 40 (main surrounding marks 42 and auxiliary surrounding marks 44) arranged around each main scale mark 32 constituting the reference grid PB.

Subsequently in step S4, the amount of deviation between the reference grid PB formed in the shot region SH of the wafer W in step S1 and the shot for measuring PC formed in the shot region SH of the wafer W in step S2, i.e. the relative positional relationship of the plurality of main scale marks 32 constituting the reference grid PB and the plurality of auxiliary scale marks 34 constituting the shot for measuring PC, is measured.

As described above, the auxiliary scale marks 34 constituting the shot for measuring PC are superimposed over the plurality of main scale marks 32 formed in the shot region SH of the wafer W.

Thus, by using a positional measuring device to image-process the overlay between the main scale marks 32 and the auxiliary scale marks 34 arranged at a plurality of positions in the shot region SH, the amount of deviation between the main scale marks 32 and the auxiliary scale marks 34 in the shot region SH can be measured.

As shown in FIG. 3B, a mark formed by superimposition of the main surrounding mark 42 and the auxiliary surrounding mark 44, and a mark formed by superimposition of the main scale mark 32 and the auxiliary scale mark 34, each constitute a box-in-box mark (FIG. 3B showing an example of a mark formed by superimposition of the main surrounding mark 42 and the auxiliary surrounding mark 44). The amount of deviation of the inner square (auxiliary surrounding mark 44 and auxiliary scale mark 34) relative to the outer square (main surrounding mark 42 and main scale mark 32) can be determined by using an image processing measuring instrument and the like to capture an image of the box-in-box mark.

In step S5, the shape of the reference grid PB is corrected based on the relative positional relationship of the main scale marks 32 constituting the reference grid PB measured in step S3; the shape of the shot for measuring PC formed in the shot region SH, i.e., the lens distortion, is then calculated based on the corrected reference grid $PB_0$ and the amount of deviation between the main scale marks 32 and auxiliary scale marks 34 measured in step S4.

The lens distortion of the projection optical system PL is determined by measuring the amount of deviation (positional deviation between the main scale marks 32 and the auxiliary scale marks 34) at a plurality of measurement points (overlay between the main scale marks 32 and the auxiliary scale marks 34) of the reference grid PB formed in the shot region SH of the wafer W and the shot for measuring PC superimposed over the reference grid PB.

However, when exposing the reference grid PB to the wafer W, the wafer stage WST holding the wafer W must be minutely moved. Therefore, the reference grid PB includes positioning error of the wafer stage WST.

Accordingly, the position of each of the main scale marks 32 in the reference grid PB is corrected from the relative positional relationship of the main scale marks 32 constituting the reference grid PB measured in step S3, and a reference grid $PB_0$ having an ideal shape that does not include positioning error of the wafer stage WST is calculated.

The amount of deviation between ideal positions of the main scale marks 32 and the auxiliary scale marks 34 of the shot for measuring PC is determined based on the shape of the reference grid $PB_0$ thus calculated and the amount of deviation of the auxiliary scale marks 34 with respect to the uncorrected main scale marks 32 measured in step S4. That is, the shape of the shot for measuring PC with respect to the shot region SH is calculated.

The shape of the shot for measuring PC thus determined, i.e., the average amount of deviation of the plurality of auxiliary scale marks 34, is then calculated as the lens distortion of the projection optical system PL in the shot region SH.

The relative positional relationship between the main scale marks 32 constituting the reference grid PB measured in step S3 is determined by measuring the surrounding marks 40 in the following manner.

Taking an arbitrary nth main scale mark 32, the amount of relative positional deviation of an adjacent main scale mark 32 (n+1) with respect to the nth main scale mark 32 is determined between measuring the overlap of the surrounding marks 40 (overlap between the main surrounding marks 42 and the auxiliary surrounding marks 44). Expressing this deviation amount as ($\Delta x1$ and $\Delta y1$), the (n+1) main scale mark 32 deviates with respect to the nth main scale mark 32 by ($\Delta x1$ and $\Delta y1$) in the X-direction and Y-direction respectively.

Subsequently, the amount of relative deviation between the (n+1) main scale mark 32 and its adjacent (n+2) main scale mark 32 is similarly determined by measuring the overlap of the surrounding marks 40 to obtain the amount of relative positional deviation between the (n+1) main scale mark 32 and the (n+2) main scale mark 32. Expressing this as ($\Delta x2$ and $\Delta y2$), the (n+2) main scale mark 32 deviates with respect to the nth main scale mark 32 by ($\Delta x1+\Delta x2$ and $\Delta y1+\Delta y2$) in the X-direction and the Y-direction respectively. That is, the amounts of relative positional deviation of all the main scale marks 32 can be calculated by sequentially repeating this calculation using the main scale mark 32 as a reference.

However, when the amounts of positional deviation of the main scale marks 32 are determined simply by adding the measured values of the surrounding marks 40 as in the method described above, measurement error contained in each measured value may be accumulated, increasing the error and making it difficult to calculate an accurate reference grid PB.

Preferably therefore, the reference grid PB is calculated after inserting an evaluation function that expresses alignment error in the alignment of main scale marks 32 (reference grid PB) calculated from measured values of the surrounding marks 40, and statistically determining the most appropriate positions of the main scale marks 32 such as to minimize this evaluation function.

As for the specific method, while it is possible to use methods disclosed in, for example, Japanese Patent Application Publication No. 2006-106240, such as vector search method, mountain climb method, genetic algorithm, and simplex method, it is also possible to use various other types of statistical methods.

This makes it possible to determine a reference grid $PB_0$ that contains almost no error, thereby enabling the lens distortion of the projection optical system PL to be determined with high precision.

In this way, the shape of the reference grid PB is corrected based on the relative positional relationship between the main scale marks 32 constituting it, and the lens distortion of the projection optical system PL is calculated based on the amount of deviation of the corrected reference grid $PB_0$ and the shot for measuring PC, whereby the lens distortion of the projection optical system PL can be determined with high precision. That is, in comparison with a conventional case where the lens distortion of the projection optical system PL is determined based on the amount of deviation between the reference grid PB and the shot for measuring PC, it becomes possible to greatly reduce effects of positioning error of the wafer stage WST when forming the reference grid.

In a practical example, while the amount of deviation at measurement points of the reference grid PB and the shot for measuring PC in the conventional method varies by approximately 5 nm, the method according to the invention reduces this variation to approximately 2 nm. Therefore, according to the method of the invention, lens distortion of the projection optical system PL can be determined with high precision.

The above method of measuring lens distortion is performed for all shot regions SH of the wafer W, and the imaging characteristics of the projection optical system PL can be optimized by driving the imaging characteristics adjusting device 10 based on the result. This enables minute circuit patterns and the like to be exposed on the wafer W with high precision.

Subsequently, a modification of surrounding marks 40 will be explained.

Figure 5:
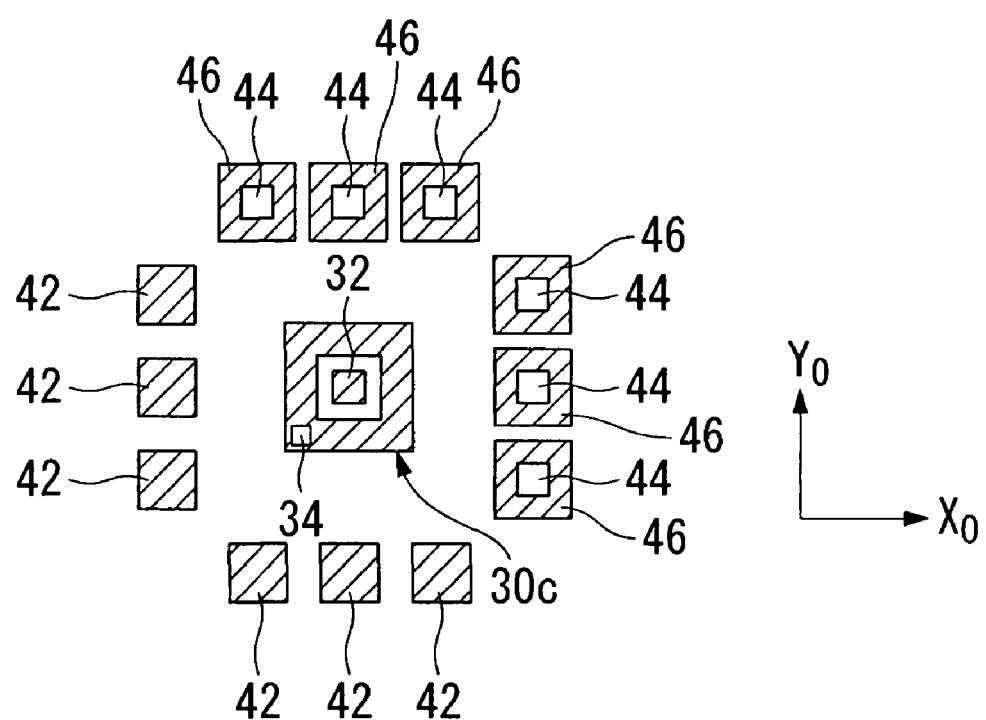
FIG. 5 shows a modification of surrounding marks.

FIG. 5 is a modification of surrounding marks 40 arranged around a mark 30c.

As shown in FIG. 5, three main surrounding marks 42 are arranged at adjacent the $-X_0$-direction side and the $-Y_0$-direction side of the mark 30c, and three auxiliary surrounding marks 44 are arranged at the $+X_0$-direction side and the $+Y_0$-direction side of it. By using a plurality of marks (three main surrounding marks 42 and three auxiliary surrounding marks 44) to constitute the surrounding marks 40 arranged around the mark 30c, when determining the relative positional relationship of the main scale marks 32 in step S3 mentioned above it becomes possible to measure, not only the amount of deviation of the main scale marks 32 in the $X_0$ and $Y_0$ directions, but also the rotational angle in the θZ-direction.

This enables the reference grid PB to be corrected even more accurately. Therefore, lens distortion of the projection optical system PL can be measured even more accurately.

Incidentally, while FIG. 5 is an example of an arrangement including three main surrounding marks 42 and three auxiliary surrounding marks 44, it is necessary only to provide two or more of each.

Subsequently, a modification of a reticle TR will be explained.

Figure 6:
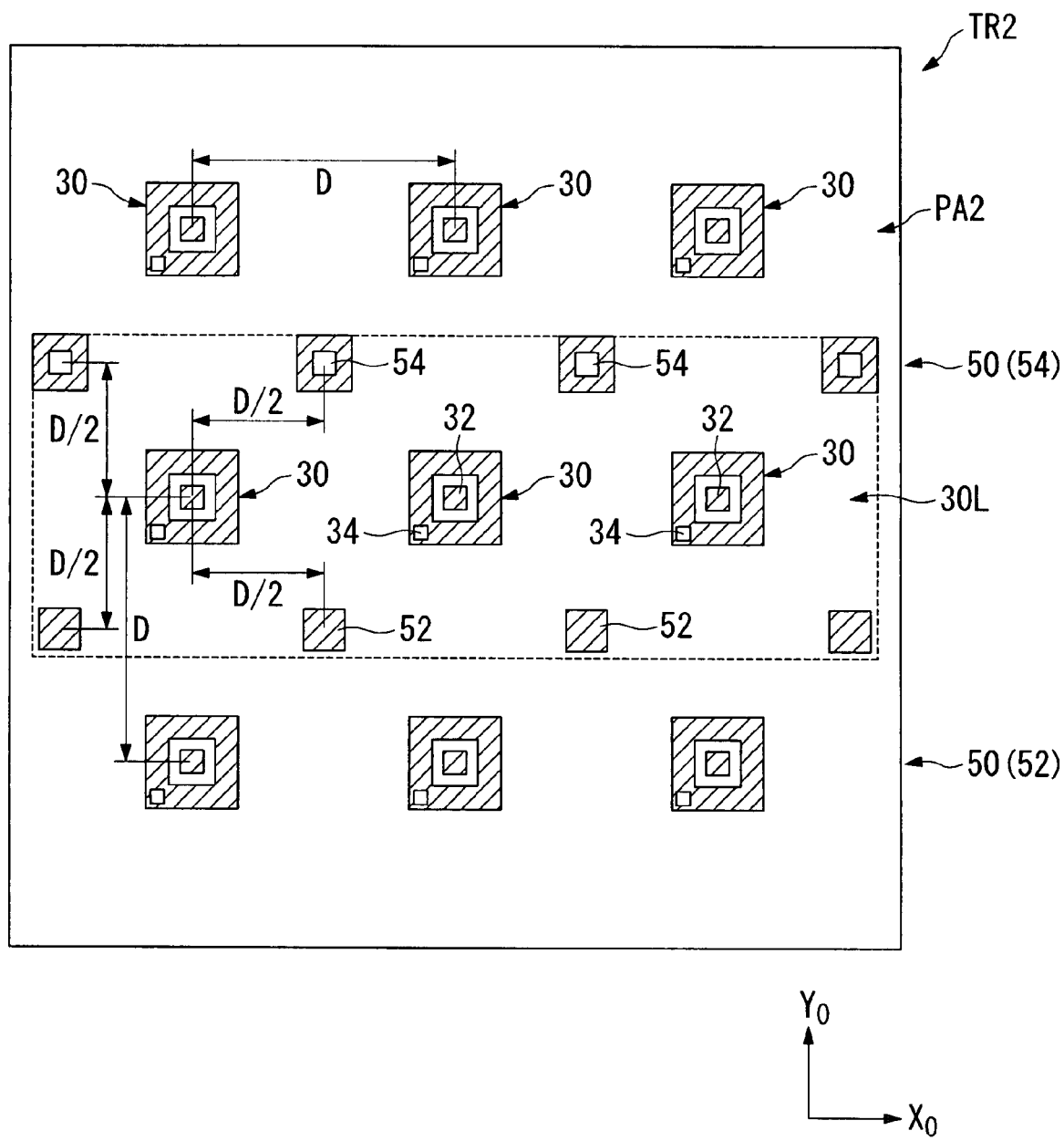
FIG. 6 is a conceptual view showing a reticle according to another embodiment.

FIG. 6 is a conceptual view of a reticle TR2 according to this embodiment. Constituent parts which are identical to those of the reticle TR are represented by identical reference numerals and are not repetitiously explained.

The reticle TR2 resembles the reticle TR in having a pattern PA2 constituted from a plurality of light-blocking marks 30 that are orderly arranged at predetermined intervals in the $X_0$ and $Y_0$ directions.

As shown in FIG. 6, surrounding marks 50 are arranged around a plurality of marks 30 that are arranged in a row in the $X_0$ direction substantially at the center of the $Y_0$ direction (hereinafter 'mark group 30L').

The surrounding marks 50 are constituted by a plurality of main surrounding marks 52 that are arranged at intervals of D/2 in the $-Y_0$ direction of the mark group 30L and also arranged in a row in the $X_0$ direction, and a plurality of auxiliary surrounding marks 54 that are arranged at intervals of D/2 in the $+Y_0$ direction of the mark group 30L and arranged in a row in the $X_0$ direction. That is, the plurality of main surrounding marks 52 and the plurality of auxiliary surrounding marks 54 are arranged at intervals which are identical to those of the plurality of marks 30. Furthermore, the main surrounding marks 52 and the auxiliary surrounding marks 54 are arranged at intermediary positions in the $X_0$ direction of the marks 30 of the mark group 30L.

The shapes of the main surrounding marks 52 are identical to those of the main surrounding marks 42, and the shapes of the auxiliary surrounding marks 54 are identical to those of the auxiliary surrounding marks 54.

Figure 7:
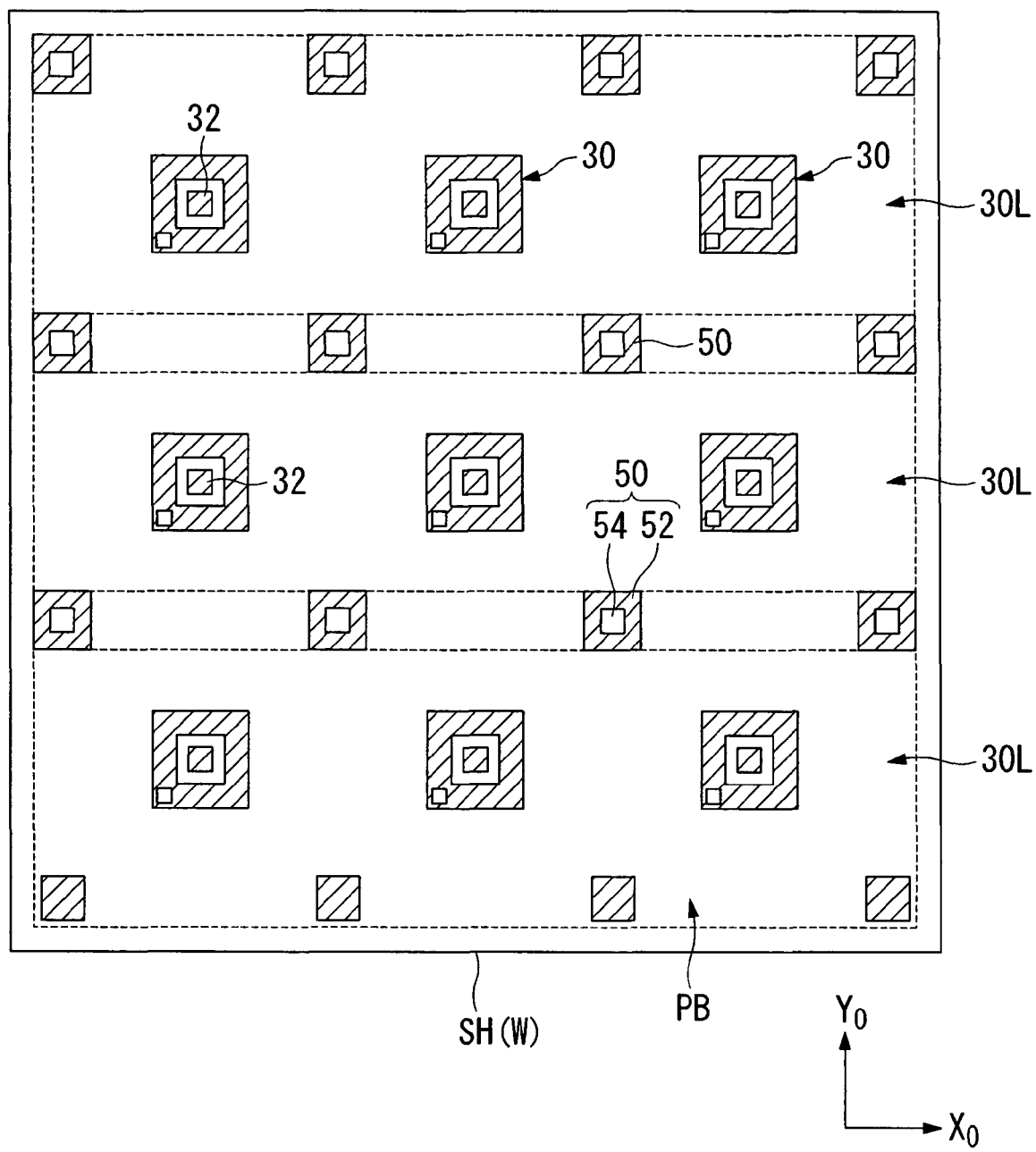
FIG. 7 shows a reference grid formed using a reticle.

By using the reticle TR2, when forming a reference grid PB in one shot region SH of the wafer W in step S1 mentioned above, the number of exposures can be reduced in comparison with when using the reticle TR. That is, as shown in FIG. 7, the opening S of the blind 6 of the reticle TR2 of the illumination optical system IL is set such that only the mark group 30L and the surrounding marks 50 arranged around it (the area inside the broken lines in FIG. 7) form an illumination region. This enables the reference grid PB to be formed in the shot region SH merely by performing exposure while moving the wafer stage WST in the $Y_0$ direction.

When measuring the relative positional relationships of main scale marks 32 of the reference grid PB in step S3 described above, the overall number of measurements can be reduced by determining in advance the relative positional relationships between the plurality of main scale marks 32 that are arranged in a row in the $X_0$ direction. That is, since the plurality of main scale marks 32 arranged in a row in the $X_0$ direction are exposed collectively by the mark group 30L of the reticle TR2, they can be handled as one batch of marks (as main scale mark group 32L). In other words, the reference grid PB can be handled as a collective plurality of main scale mark groups 32L.

Therefore, only the relative positional relationships of the main scale mark groups 32L that are parallel to the $Y_0$ direction need be measured. Specifically, since the main surrounding marks 52 arranged in a row in the $X_0$ direction and the auxiliary surrounding marks 54 arranged in a row in the $X_0$ direction are formed in superimposition, the degree of superimposition between them is measured.

The relative positional relationships of the main scale marks 32 of the entire reference grid PB can be then determined based on the relative positional relationships of the main scale mark groups 32L and the relative positional relationships of the main scale marks 32 of the main scale mark groups 32L.

Since the main scale mark groups 32L are arranged in a row in the $X_0$ direction, their relative rotational angles can be measured.

By using the reticle TR2 in this way, the load of measuring the lens distortion of the projection optical system PL can be reduced.

Preferably, the exposure process is performed after matching the $Y_0$ direction of the reticle TR2 with the scanning direction of the exposure apparatus EX (Y-direction). To form the reference grid PB, the alignment direction of the plurality of main scale mark groups 32L ($X_0$ direction) is orthogonal to the exposure direction of the shot for measuring PC (i.e., scanning direction), obtaining advantages such as ensuring that the alignment of the main scale marks 32 in the $X_0$ direction does not contain synchronous movement error of the wafer stage WST in the X-direction.

While preferred embodiments of the invention have been described above, it should be understood that the operational procedures, shapes of the constituent elements, their combinations, and so on are merely examples, and that additions, omissions, substitutions, and other modifications can be made without departing from the spirit or scope of the present invention.

The invention includes modifications such as the following.

For example, while the above explanation describes a case where the main scale marks 32, the auxiliary scale marks 34, the main surrounding marks 42 and 52, and the auxiliary surrounding marks 44 and 54 are box-shaped, they can be cross-shaped or another shape that is suitable for the measuring instrument being used.

While the above explanation describes a case where all the marks 30 include main scale marks 32 and auxiliary scale marks 34, with regard to the marks 30 concealed by the blind 6 in step S1 it is acceptable only to form the auxiliary scale marks 34. Furthermore, while in this embodiment the surrounding marks 40 are arranged around the mark 30c at the center of the reticle for forming the reference grid PB, this is not limitative of the invention. For example, surrounding marks 40 can be arranged around a mark 30 at a position other than the center and used in forming the reference grid PB, or another reticle can be provided for forming the reference grid PB and the mark 30 and the surrounding marks 40 can be formed in this reticle.

Steps S1 and S2 need not be performed in that order, it being possible to perform step S1 after performing step S2. Similarly, steps S3 and S4 need not be performed in that order, it being possible to perform step S3 after performing step S4.

The foregoing embodiment of the invention describes an example of measuring lens distortion that causes warping of the shot shape. However, the cause of shot shape warping is not limited to this; for example, in a scanning-type projection exposure apparatus, the shot shape is warped not only by lens distortion of the projection optical system but also by synchronous movement error between the wafer stage and the reticle stage. The invention can, of course, be applied in measuring the shape of a shot formed by such scanning exposure.

While the above embodiment describes an example where a KrF excimer laser, an ArF excimer laser, or the like, is used as the light source, this is not limitative of the invention, it being possible to use an F2 laser or an Ar2 laser as the light source, or to use high-frequency waves from a metal vapor laser or a YAG laser as illumination light for exposure. Alternatively, an infrared region oscillating from a DFB semiconductor laser or a fiber laser, or visible single-wavelength laser light, is amplified by a fiber lamp doped with, for example, erbium (Er) (or both erbium and ytterbium (Yb)) and wavelength-converted to ultraviolet light using a nonlinear optical crystal to obtain high-frequency waves, which are then used as illumination light for exposure.

The invention can be applied not only in an exposure apparatus used in manufacturing a semiconductor element, but also in an exposure apparatus that is used in manufacturing a liquid crystal display (LCD) and the like and transfers a device pattern onto a glass plate, an exposure apparatus that is used in manufacturing a thin-film magnetic head and transfers a device pattern onto a ceramic wafer, an exposure apparatus that is used in manufacturing an image-capturing element such as a CCD, and so on.

The projection optical system PL can include any one of a refracting system, a catadioptric system, and a reflecting system, or any one of a compressing system, a magnifying system, and an enlarging system.

The invention can also be applied in an exposure apparatus that transfers a circuit pattern to a glass substrate, a silicon wafer, and such like, in order to manufacture a reticle and a mask that are used in a light exposure apparatus, an EUV exposure apparatus, an X-ray exposure apparatus, an electron beam exposure apparatus, and such like. In exposure apparatuses that utilize deep ultraviolet (DUV) light, vacuum ultraviolet (VUV) light, and such like, it is conventional to use transparent reticles, and a reticle substrate of quartz glass, quartz glass doped with fluorine, phosphorus, magnesium flouride, crystalline quartz, and such like, is used as a reticle substrate. In a proximity method X-ray exposure apparatus, electronic exposure apparatuses, and such like, transparent masks (stencil mask, membrane mask) are used, and a silicon wafer or the like is used as the reticle substrate.

Provided that necessary liquid countermeasures are appropriately taken, the invention can also be applied in an immersion exposure apparatus that forms a predetermined pattern on a substrate (wafer) via a liquid supplied between a projection optical system and the substrate. A structure and an exposure operation of an immersion exposure apparatus are disclosed in, for example, PCT International Publication No. WO99/49504 and Japanese Unexamined Patent Application, Publication No. H06-124873.

The invention can also be applied in a twin stage exposure apparatus. A structure and an exposure operation of a twin stage exposure apparatus are disclosed in, for example, Japanese Unexamined Patent Application, Publication Nos. H10-163099 and H10-214783, Published Japanese Translation No. 2000-505958 of PCT International Application, or U.S. Pat. No. 6,208,407. As disclosed in Japanese Unexamined Patent Application, Publication No. H11-135400, the invention can also be applied in an exposure apparatus including a movable exposure stage that holds a substrate for processing such as a wafer, and a measuring stage that includes various types of measuring members and sensors.

The invention claimed is:

1. A method of measuring shot shape comprising:
   sequentially exposing a substrate with main scale marks in compliance with a predetermined map, and forming a reference grid including a plurality of the main scale marks arranged in the predetermined map in at least one shot region;
   exposing a shot for measuring, via a projection optical system, that includes a plurality of auxiliary scale marks arranged in the predetermined map in the shot region;
   measuring a relative positional relationship between adjacent main scale marks in the shot region exposed on the substrate;
   measuring an amount of deviation between the main scale marks and the auxiliary scale marks; and correcting the reference grid based on the measured relative positional relationship so that the corrected reference grid does not include positioning error of the substrate caused in the process of forming the reference grid, and calculating a shot shape of the shot for measuring based on the corrected reference grid and the amount of deviation.

2. The method of measuring shot shape according to claim 1, wherein, simultaneous to exposing the substrate with the main scale marks, surrounding marks, which are used in measuring a relative positional relationship between a main scale mark of the plurality of main scale marks and another main scale mark of the plurality of main scale marks formed adjacent to the main scale mark of the plurality of main scale marks, are formed between the main scale mark and the other main scale mark, and each one of the surrounding marks individually surrounds a separate one of the main scale marks.

3. The method of measuring shot shape according to claim 1, wherein the reference grid is formed by multiple exposures of main scale mark groups, constituted by grouping the plurality of main scale marks, in the shot region exposed on the substrate.

4. The method of measuring shot shape according to claim 3, wherein each main scale mark group is formed such that the plurality of main scale marks in the main scale mark group are arranged in a row.

5. The method of measuring shot shape according to claim 1, wherein the calculation of the shot shape includes correcting the reference grid by using a statistical method of processing the relative positional relationship that is measured.

6. A mask comprising:

at least one main scale mark;

auxiliary scale marks that are arranged in a grid formation along a first direction and a second direction orthogonal to the first direction, each of the auxiliary scale marks and the main scale mark are superimposed to indicate a relative amount of deviation between them; and at least one pair of surrounding marks arranged such as to sandwich the main scale mark, the pair of surrounding marks including a main surrounding mark, and an auxiliary surrounding mark that is separated by a grid interval of the auxiliary scale mark from the main surrounding mark, and the auxiliary surrounding mark and the main surrounding mark are superimposed to indicate a relative amount of deviation between the main surrounding mark and the auxiliary surrounding mark, wherein the main surrounding mark and the auxiliary surrounding mark are located at a same distance from the main scale mark, the distance is half of the grid interval of the auxiliary scale mark.

7. The mask according to claim 6, wherein a plurality of the main scale marks are arranged in a row along the first direction; and the main surrounding mark and the auxiliary surrounding mark are arranged in separation along the second direction.

8. The mask according to claim 7, which is used by being mounted on a scanning exposure apparatus, the marks being arranged such that the second direction becomes a scanning direction of the scanning exposure apparatus.

* * * * *